United States Patent
Papadopoulou et al.

(10) Patent No.: US 7,661,080 B2
(45) Date of Patent: Feb. 9, 2010

(54) METHOD AND APPARATUS FOR NET-AWARE CRITICAL AREA EXTRACTION

(75) Inventors: Evanthia Papadopoulou, Baldwin Place, NY (US); Sarah Braasch, Richmond, VT (US); Mervyn Y. Tan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 11/626,576

(22) Filed: Jan. 24, 2007

(65) Prior Publication Data
US 2008/0178137 A1    Jul. 24, 2008

(51) Int. Cl.
*G06F 17/50*    (2006.01)
(52) U.S. Cl. .................................... 716/4; 716/5
(58) Field of Classification Search .................. 716/4, 716/5, 19–21
See application file for complete search history.

(56) References Cited

U.S. PATENT DOCUMENTS

| | | | |
|---|---|---|---|
| 6,178,539 B1 * | 1/2001 | Papadopoulou et al. | 716/7 |
| 6,247,853 B1 * | 6/2001 | Papadopoulou et al. | 716/4 |
| 6,317,859 B1 * | 11/2001 | Papadopoulou | 716/4 |
| 6,918,101 B1 * | 7/2005 | Satya et al. | 716/5 |
| 6,948,141 B1 * | 9/2005 | Satya et al. | 716/4 |

* cited by examiner

*Primary Examiner*—Vuthe Siek

(57) ABSTRACT

In one embodiment, the present invention is a method and apparatus for net-aware critical area extraction. One embodiment of the inventive method for determining the critical area of an integrated circuit includes modeling a net corresponding to the integrated circuit as a graph, where the net is made up of a plurality of interconnected shapes spanning one or more layers of the integrated circuit. All generators for opens are then defined and identified. The Voronoi diagram of the identified generators is computed, and the critical area is computed in accordance with the Voronoi diagram.

30 Claims, 5 Drawing Sheets

METHOD AND APPARATUS FOR NET-AWARE CRITICAL AREA EXTRACTION

BACKGROUND

The present invention relates generally to very-large-scale integration (VLSI) devices, and relates more particularly to predicting the yield of VLSI chips.

Critical area is a measure of the sensitivity of a VLSI chip design to random particle defects and is widely used to predict the yield of a VLSI chip in the presence such defects. For example, extra material defects may cause shorts (short circuits) between different conducting regions, while missing material defects may cause opens (open circuits). The latter case occurs when a conducting path is broken into two or more pieces. To reduce the occurrence of opens, many VLSI chip designers insert redundant interconnects (loops) in their designs. These loops provide alternate routes that allow a circuit to remain connected in the presence of defects that might otherwise cause an open. At the same time, however, the loops increase the potential for shorts. Accurate critical area computation is essential in balancing these competing concerns.

Accurate and efficient computation of critical area is therefore very important in integrated circuit (IC) manufacturing, especially when design for manufacturability (DFM) initiatives are a consideration. Conventional tools for computing critical area, however, fail to account for the loops described above, and thereby overestimate the actual critical area for opens while (correctly) registering an increase in critical area for shorts. This is because these tools assume that interconnects are routed in a tree fashion, and thus any defect that breaks any conducting path is assumed to create an open. As a result, designs incorporating loops are erroneously penalized.

Thus, there is a need in the art for a method and apparatus for net-aware critical area extraction.

SUMMARY OF THE INVENTION

In one embodiment, the present invention is a method and apparatus for net-aware critical area extraction. One embodiment of the inventive method for determining the critical area of an integrated circuit includes modeling a net corresponding to the integrated circuit as a graph, where the net is made up of a plurality of interconnected shapes spanning one or more layers of the integrated circuit. All generators for opens are then defined and identified. The Voronoi diagram of the identified generators is computed, and the critical area is computed in accordance with the Voronoi diagram.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a method and apparatus for net-aware critical area extraction. Specifically, the method and apparatus of the present invention provide a net-aware means of accurately computing critical area for opens, even in the presence of loops. By net-aware, it is meant that a defect forms a fault if it is actually breaking a net (i.e., the net's terminal points are disconnected). In one embodiment, the problem of computing critical area is modeled as a graph problem and solved efficiently by exploiting the geometric nature of the graph problem.

The critical area of a circuit layout on a layer A of an IC is defined as:

$$A_c = \int_0^\infty A(r)D(r)dr \qquad (\text{EQN. 1})$$

where $A(r)$ denotes the area in which the center of a defect of radius r must fall in order to cause circuit failure, and $D(r)$ is the density function of the defect size.

Critical area analysis is typically performed on a per-layer basis, and results from all layers are combined to estimate the total yield of the IC design. The defect density function, $D(r)$, may be estimated as:

$$D(r) = \begin{cases} cr^q/r_0^{q+1}, & 0 \le r \le r_0 \\ cr_0^{p-1}/r^p, & r_0 \le r \le \infty \end{cases} \qquad (\text{EQN. 2})$$

where p and q are real numbers (typically, p 3 and q=1), $c=(q+1)(p-1)/(q+p)$ and $r_0$ is some minimum optically resolvable size. Using the typical values for p, q and c, one can derive the widely used defect size distribution, $D(r)=r_0^2/r^3$ ($r_0$ is typically smaller than the minimum feature size, thus $D(r)$ is ignored for $r<r_0$). In accordance with common practice, to facilitate critical area computation, a defect of size r is herein modeled as a square of radius r (i.e., a square of side 2r).

For simplicity of presentation, it is assumed that, given a layer, A, of an integrated circuit (IC), overlapping shapes have been unified into disjoint polygons (where a polygon may be simple, or alternatively may contain holes if same-layer loops are present). With this is mind, a "defect", D, is defined as a "minimal break" of a simple shape, P, if: (1) the defect, D, breaks the shape, P, into at least two pieces; and (2) the defect, D, has minimal size (i.e., if the defect, D, is shrunk by $\epsilon \geq 0$, then the defect, D, will be entirely contained within the interior of the shape, P). A piece of the shape, P, may trivially consist of a single edge. A minimal break is considered to be "strictly minimal" if it contains no other minimal break in its interior. A "break" is any defect that totally overlaps a minimal break.

Figure 1:
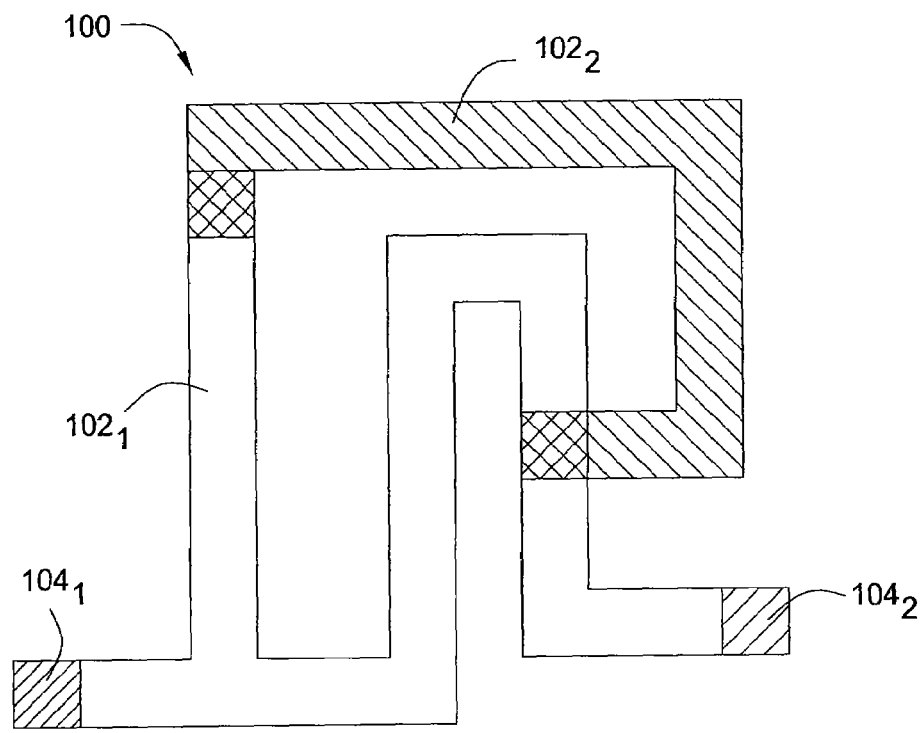
FIG. 1 illustrates an exemplary simple net that spans two metal layers.

FIG. 1 is a schematic diagram illustrating several concepts associated with the present invention. Specifically, FIG. 1 illustrates an exemplary simple net 100 that spans two metal layers $102_1$-$102_2$ (hereinafter collectively referred to as "layers 102"). Further, for the purposes of the present invention, a "net" such as the net 100 is defined, from an IC layout perspective, as a collection of interconnected shapes that span a number of layers of the IC. These shapes are "terminal shapes" if they represent entities that must be interconnected by the net (e.g., power buses, gates, sources and drains of transistors, pins of macros or other user-defined entities, among others). For example, in FIG. 1, the simple net 100 comprises two terminal shapes $104_1$-$104_2$ (hereinafter collectively referred to as "terminal shapes 104").

A "minimal open" is defined herein as a defect, D, that breaks a net, N, where the defect, D, has minimal size (i.e., if the defect, D, is shrunk by $\epsilon > 0$, then the defect, D, no longer breaks the net, N). The defect, D, breaks the net, N, if any two terminal shapes in the net, N, become disconnected or if at least one terminal shape in the net, N, is broken. A minimal open is "strictly minimal" if it contains no other minimal open in its interior. An "open" is any defect, D, that entirely covers a minimal open.

Figure 2:
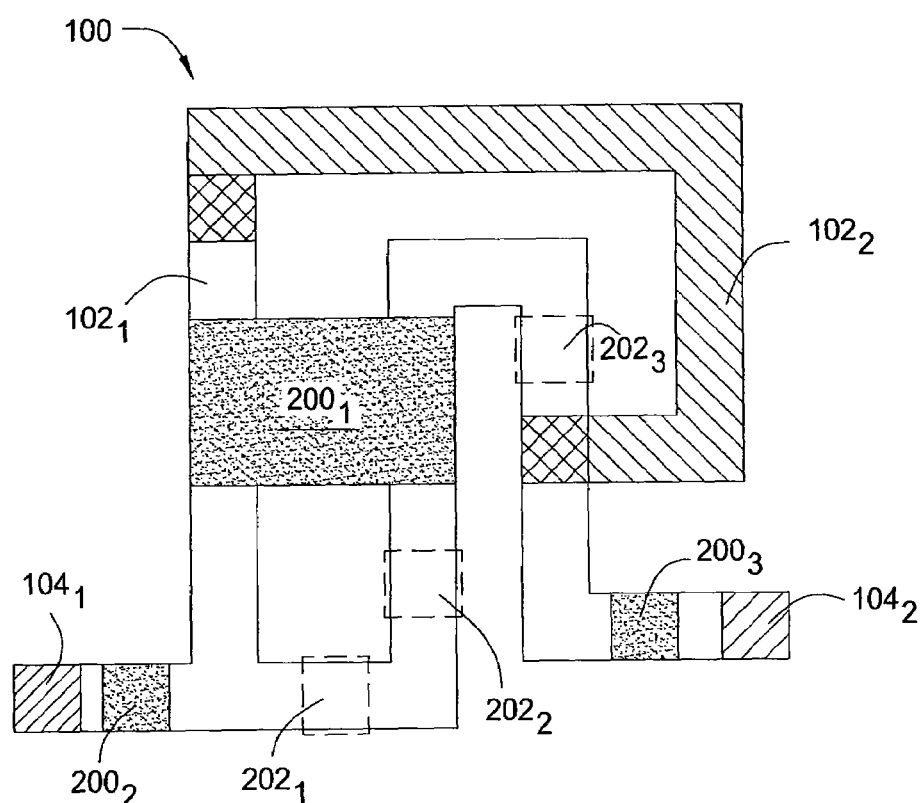
FIG. 2 is a schematic diagram illustrating the exemplary simple net of FIG. 1, this time including a plurality of defects that cause breaks (and consequently opens) and a plurality of defects that cause no breaks (and thus are not considered faults)

As long as all terminal shapes comprising a net remain interconnected, the net is considered to be functional; otherwise, the net is considered to be broken. Thus, if a defect disconnects a piece of the net that contains no terminal shapes, the defect should not be considered a fault (because the net is not broken). A defect may cause a net to break in two ways: (1) the defect breaks all possible paths along the net between two terminal shapes; or (2) the defect breaks (i.e., destroys) a terminal shape itself. FIG. 2 is a schematic diagram illustrating the exemplary simple net 100, this time including a plurality of defects $200_1$-$200_3$ (hereinafter collectively referred to as "defects 200") that cause opens and a plurality of defects $202_1$-$202_3$ (hereinafter collectively referred to as "defects 202") that cause breaks on the shape of layer M1 but cause no opens (and thus are not considered faults). As illustrated, the defects 200 that do cause opens each affect all possible paths between the terminal shapes 104, while the defects 202 that do not cause opens each affect less than all possible paths.

The center of an open is herein referred to as a "generator point" and is weighted with the size of the open. A generator point is "strictly minimal" if it is the center of a strictly minimal open. If a defect, D, creates an open by breaking a single polygonal path (interconnect), the generator point is referred to as a "first order generator point". If a defect, D, creates an open by breaking a number, k, of polygonal paths on a single layer, the generator point is herein referred to as a "$k^{th}$ order generator point". A segment formed as a union of $k^{th}$ order generator points for opens is herein referred to as a "$k^{th}$ order generator segment". If the opens are strictly minimal, then the generator segment is also referred to as "strictly minimal". Herein, the term "generator" will be used to refer to both generator points and generator segments.

Figure 3:
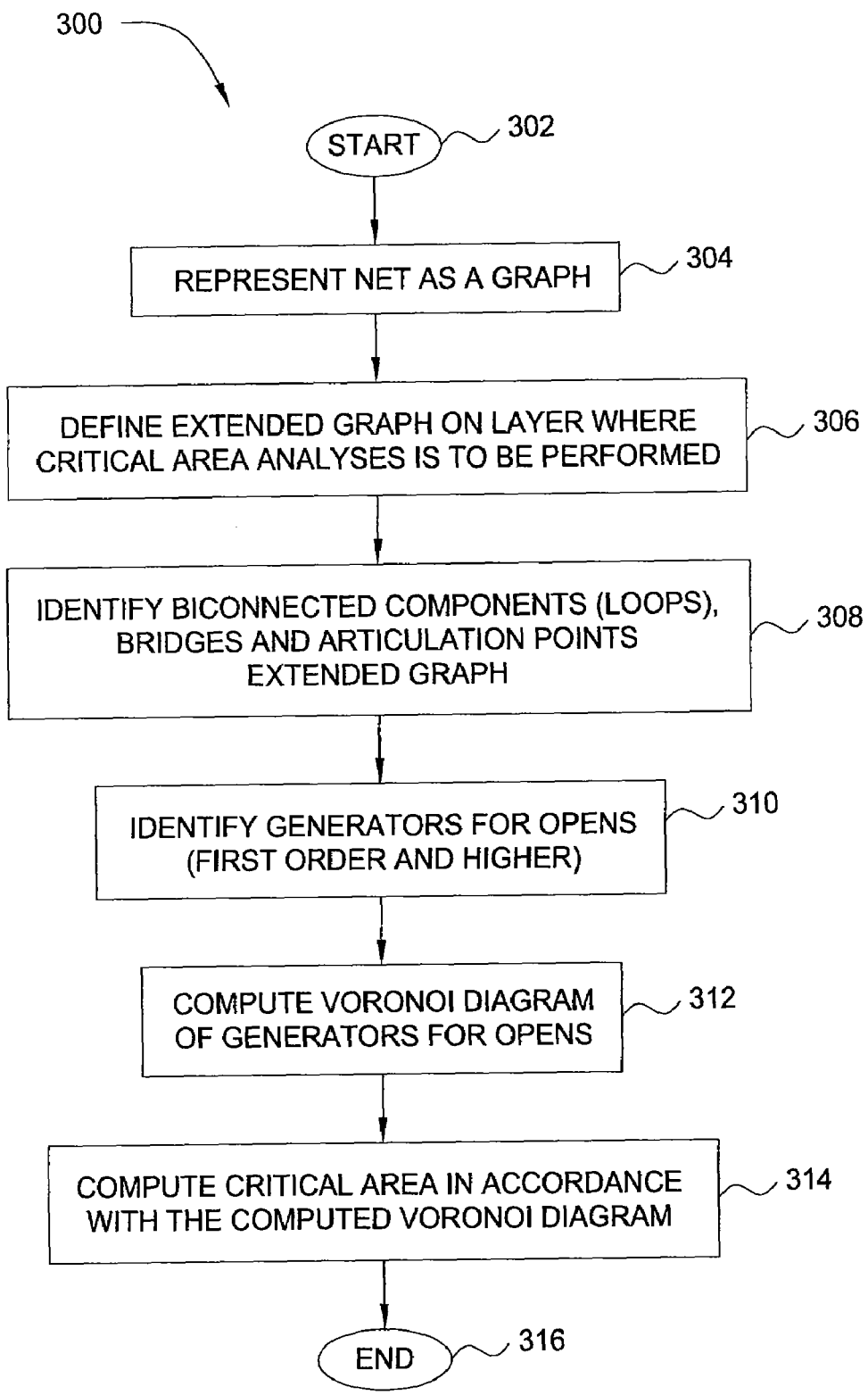
FIG. 3 is a flow diagram illustrating one embodiment of a method for computing the critical area of a net.

FIG. 3 is a flow diagram illustrating one embodiment of a method 300 for computing the critical area of a net, N. The method 300 relies in part on the concept of Voronoi diagrams, as described in greater detail by E. Papadopoulou in "Critical Area Computation for Missing Material Defects in VLSI Circuits", IEEE Transactions on Computer-Aided Design, vol. 20, no. 5, pp. 583-597, 2001, which is herein incorporated by reference in its entirety.

The net, N, includes a layer, X, where the portion of the net, N, along the layer, X is denoted as $N_X(N \cap X)$. The portion, $N_X$, of the net, N, consists of a number of connected components $N_{X_1}, \ldots, N_{X_k}$, $k \geq 1$. A connected component of the net, N, on the layer, X, is a collection of overlapping shapes that can be unioned to a single polygon (a simple polygon or a polygon with holes). For simplicity, it can be assumed that all overlapping shapes on the layer, X, have been unioned into disjoint polygons. If there are terminal shapes among the overlapping shapes, terminal information is maintained on the edges of unioned polygons that are induced by the terminal shapes, and these edges are referred to as "terminal edges".

The method 300 is initialized at step 302 and proceeds to step 304, where the method 300 represents the net, N, as a graph. In one embodiment, the net, N, is represented as a compact graph, G(N), by first representing every connected component (polygon) of the net, N, that occurs on a conducting layer (metal, poly, etc.) as a graph node. Two nodes are connected by an edge if there is at least one contact or via connecting the components represented by the nodes. Nodes representing terminal shapes are identified as "terminal nodes". There will exist at least one node for every conducting layer on which the net, N, expands.

In step 304, the method 300 defines an extended graph, G(N, A), of the net, N, on a layer, A, where critical area analysis is to be performed. In one embodiment, the graph, G(N), is extended to G(N, A) by first expanding every component of the net, N, on the layer, A, by the component's medial axis. In addition, for every via or contact that connects a component of portion $N_A$ to a component of portion $N_B$ ($B \neq A$), a point representing that via or contact (hereinafter referred to as a "via-point") is introduced along the medial axis. Finally, edges of the extended graph, G(N, A) are introduced to connect via-points to nodes of components of $N_B$.

In intuitive terms, vias or contacts are mapped to specific medial axis points, and edges are introduced to represent electrical contacts between $N_{B_j}$ and $N_{A_i}$. In the presence of via clusters (i.e., groups of adjacent vias connecting $N_{B_j}$ and $N_{A_i}$, one via-point can be used to represent the middle of the entire group of redundant vias. If a via or contact has been designated as a terminal shape, the corresponding via-point along the medial axis is also designated as terminal.

If $N_{A_i}$ contains terminal shapes, then the portions of the medial axis induced by edges of terminal shapes (terminal edges) are identified and marked as terminal. The extended graph, G(N, A), can be regarded as an ordinary graph with two types of nodes: (1) the net-component nodes of $G(N-N_A)$ (i.e., graph nodes representing components of the net, N, except for the components of $N_A$); and (2) the medial axis vertices and via-points of the components of $N_A$. The edges of the extended graph, G(N, A) can be partitioned into three types: (1) graph edges of G(N) that connect net-component nodes of $G(N-N_A)$; (2) new graph edges that connect a net component node to a via-point on $N_A$; and (3) medial axis edges on $N_A$ that connect medial axis vertices and via-points. Some of the nodes, and even some entire medial axis edges, are designated as terminal. When critical area analysis on the layer, A, is performed, edges of the third type are only vulnerable to defects on layer A. All other edges are unbreakable with respect to layer A.

Figure 4:
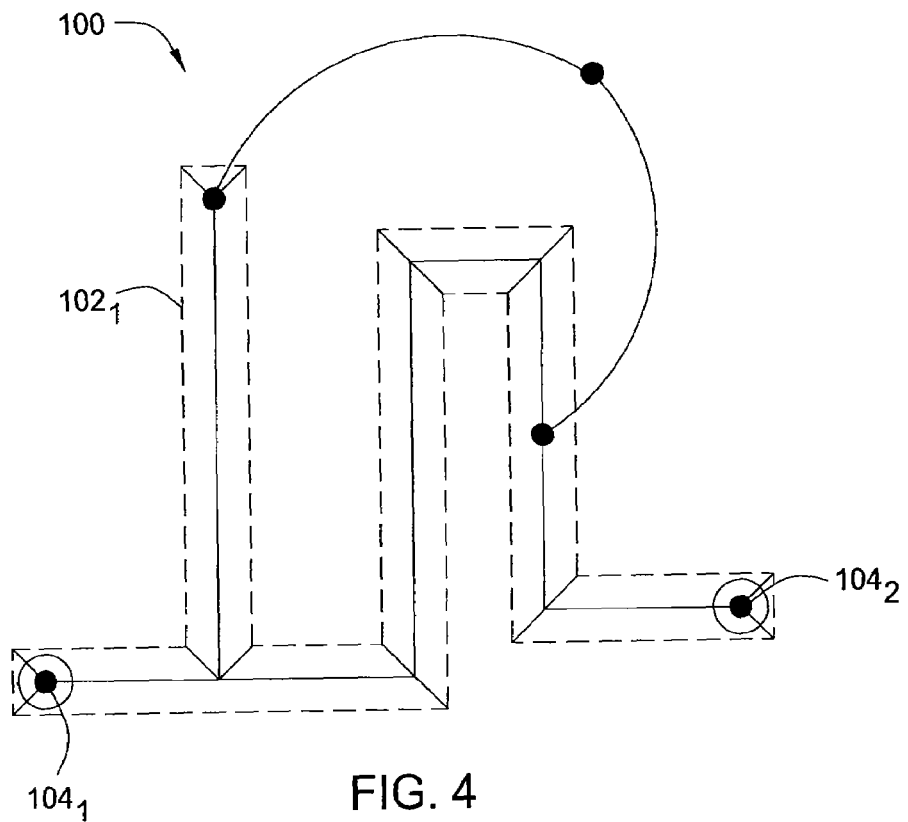
FIG. 4 is a schematic diagram illustrating an expanded graph for the exemplary net of FIG. 1.

FIG. 4, for example, is a schematic diagram illustrating an expanded graph, G(N, A) for the exemplary net 100 of FIG. 1, where A=layer $102_1$. The terminal points 104 are indicated by hollow circles. The dashed lines merely represent the original polygon of the layer $102_1$, and are not part of the extended graph G(N, $102_1$). The dark circles and arcs represent ordinary vertices and edges of the expanded graph, G(N, A).

Referring back to FIG. 3, once the extended graph, G(N, A), has been defined, the method 300 proceeds to step 308 and identifies or detects biconnected components (loops), bridges and articulation points in the extended graph. Loops are revealed by biconnected components of the graph. Given a layer, A, and any defect, D, one can determine whether the defect, D, breaks the net, N (i.e., whether the defect, D, breaks or disconnects one or more terminals of the net, N). In one embodiment, this is accomplished by partitioning the extended graph, G(N, A) into biconnected components, bridges and articulation points using depth-first search (DFS), for example as described in greater detail by J. Hopcroft et al. in "Efficient Algorithms for Graph Manipulation", Comm. ACM, vol. 16, no. 6, pp. 372-378, 1973, and R. Tarjan in "Depth-First Search and Linear Graph Algorithms", SIAM Journal on Computing, 1, 1972, 146-159, both of which are herein incorporated by reference. A biconnected component of a connected, undirected graph, G, is defined as a maximal set of edges such that any two edges in the set lie on a common simple cycle. A bridge of a graph, G, is defined as an edge whose removal disconnects the graph, G. An articulation point of a graph, G, is defined as a vertex whose removal disconnects the graph, G. Further, a "net bridge" or a "net articulation point" is an edge or vertex, respectively, whose removal disconnects the extended graph, G(N, A), leaving terminals on both sides. Ordinary bridges and articulation points that do not disconnect terminals are referred to as "simple bridges" and "simple articulation points". Terminal articulation points are net articulation points.

If $G_\pi(N, A)$ denotes a DFS tree of the extended graph, G(N, A), it is well-known that the DFS tree, $G_\pi(N, A)$, can give a decomposition of the extended graph, G(N, A) into bridges, articulation points and biconnected components in linear time. For the purpose of extracting critical area, one need only maintain some additional terminal information to determine whether the removal of a vertex or an edge actually breaks the extended graph, G(N, A). For this purpose, in one embodiment, every node i in the DFS tree, $G_\pi(N, A)$, maintains a flag indicating whether the subtree rooted at the node, i, contains a terminal point. In addition, a terminal node or terminal point is chosen as the root of the DFS tree, $G_\pi(N, A)$.

Assuming that the root of the DFS tree, $G_\pi(N, A)$, is a terminal node, one can easily determine whether a bridge or an articulation point is "net" or "simple", given the stored terminal information at the nodes, i. Simple articulation points and simple bridges, as well as any potential biconnected component that does not contain a terminal point or a net articulation point (referred to as a "simple biconnected component"), can be removed with no effect on the net connectivity regarding opens.

Figure 5:
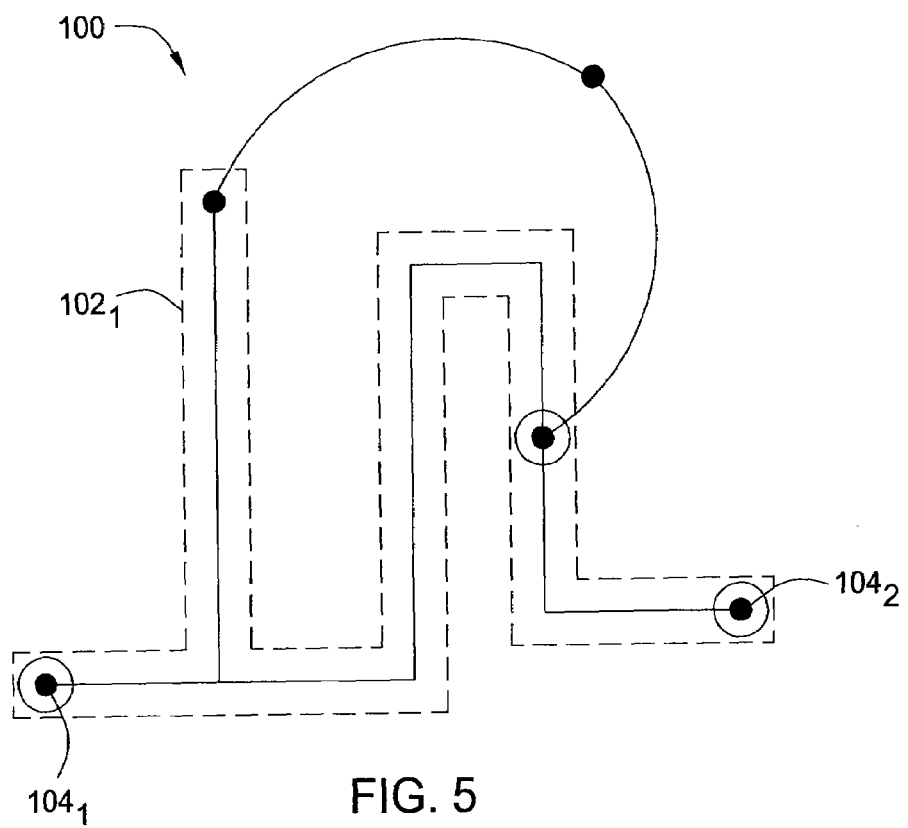
FIG. 5 is a schematic diagram illustrating the expanded graph for the exemplary net of FIG. 1, where all simple bridges, simple articulation points, and simple biconnected components have been removed from the extended graph, and thus all remaining bridges, articulation points and biconnected components are "net"

FIG. 5 is a schematic diagram illustrating the expanded graph, G(N, A) for the exemplary net 100 of FIG. 1 (i.e., as illustrated in FIG. 4), where all simple bridges, simple articulation points, and simple biconnected components (as illustrated in FIG. 4) have been removed from the extended graph, G(N, A), and thus all remaining bridges, articulation points and biconnected components are "net". Circles indicate net terminal points and net articulation points. The expanded graph, G(N, A) includes one bi-connected component.

Referring back to FIG. 3, once the loops have been detected in the extended graph, G(N, A), the method 300 proceeds to step 310 and identifies generators for opens within the extended graph, G(N, A) (i.e., first-order generators and higher). In order to identify the generators, the core of the extended graph, G(N,A), on the layer, A, must be determined. The core(N, A) is the set of all medial axis vertices, including articulation, via and terminal points, and all medial axis edges, excluding all standard forty-five-degree edges (i.e., all forty-five degree medial axis edges corresponding to bisectors of axis-parallel polygon edges). It is assumed that all trivial components, trivial bridges and trivial articulation points have been removed from the extended graph, G(N, A). The first order generators, $G_1(N, A)$, for strictly minimal opens on the layer, A, are then the bridges, terminal edges, articulation points and terminal points of G(N, A)∩core(N, A).

The core(N, A) induces a unique decomposition of $N_A$ into well-defined wire segments. Those wire segments may overlap, and their union reconstructs $N_A$ (excluding the trivial portions of $N_A$). In particular, every core point, p, induces a square wire segment, R(p), of radius w(p) centered at the core point, p. A core segment, s, induces a wire segment $R(s)=\cup_p \epsilon R(p)$. In the rectilinear case, R(s) is an axis-parallel rectangle of size w(s)×(|s|+2w(s)), where |s| denotes the length of the core segments, s, and w(s) is the weight of the core segment, s (i.e., the distance of the core segment, s, from the polygon boundary.

Consider a biconnected component of the extended graph, G(N, A), denoted as $C_i$. Let core ($C_i$) denote all core elements of the biconnected component $C_i$ (core ($C_i$)=$C_i$∩core (N, A)). Consider the weighted Voronoi diagram of core $C_i$, denoted as $V(C_i)$. Emphasize (e.g., by shading) any region of the weighted Voronoi diagram, $V(C_i)$, that belongs to an articulation or terminal point, thereby indicating that any defect generated by a point in the emphasized region is known to cause an open. In addition, emphasize any Voronoi edges and vertices bordering an emphasized region.

Figure 6:
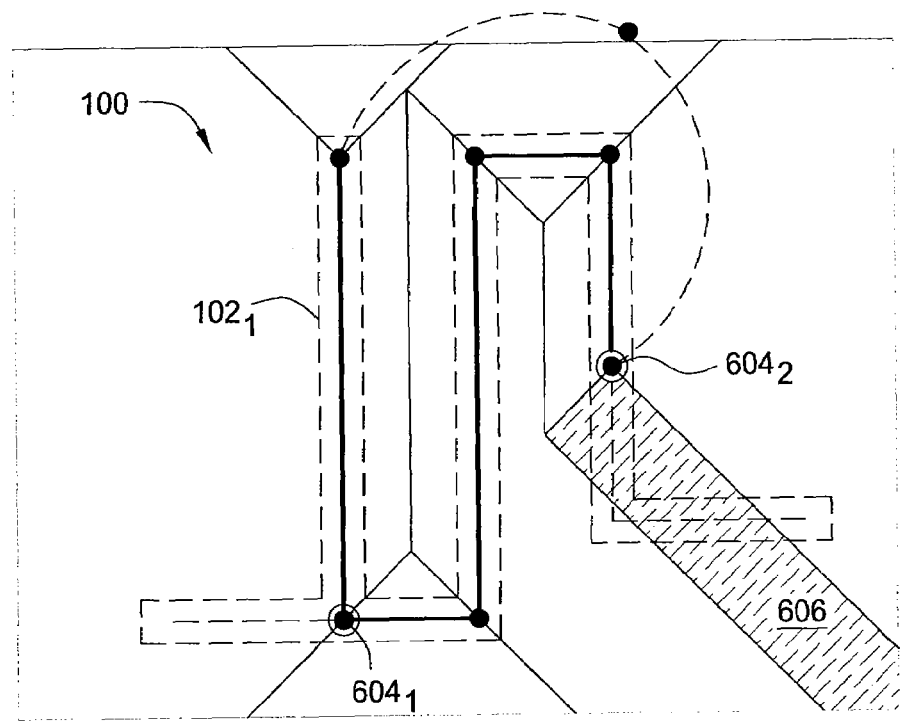
FIG. 6 is a schematic diagram illustrating the weighted Voronoi diagram, $V(C_i)$, for the exemplary net of FIG. 1.
Figure 7:
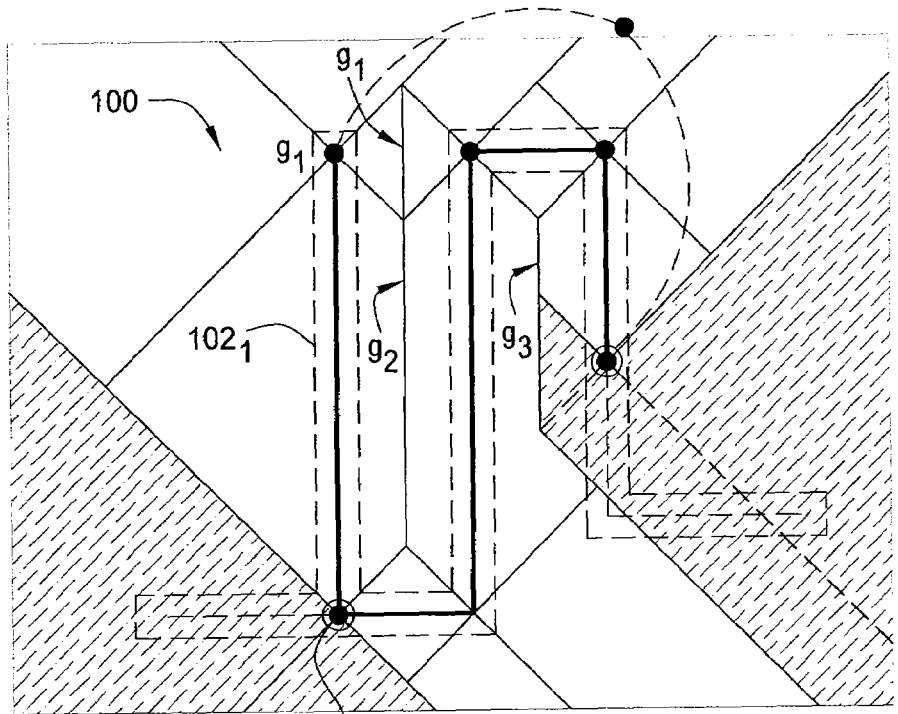
FIG. 7 is a schematic diagram illustrating the potential second-order generators of the weighted Voronoi diagram illustrated in FIG. 6.

FIG. 6, for example, is a schematic diagram illustrating the weighted Voronoi diagram, $V(C_i)$, for the exemplary net 100 of FIG. 1. The net 100 contains exactly one biconnected component, $C_i$. The weighted Voronoi diagram, $V(C_i)$, contains two articulation points $604_1$ and $604_2$. Region 606 belonging to first order generators is shaded. FIG. 7 is a schematic diagram illustrating a modified version of the weighted Voronoi diagram $V(C_i)$ in which regions of the weighted Voronoi diagram $V(C_i)$ are further subdivided into finer parts that assign maximal area to vertices of $C_i$ instead of edges. In particular, for every core point, p, all four forty-five degree rays emanating from the core point are drawn, even if the core point is the endpoint of a core segment, s. Any resulting subregion that is equidistant from the core point, p, and the core segment, s, is assigned to the core point, p (instead of the core segment, s, in the original Voronoi diagram $V(C_i)$). Any resulting subregion that is equidistant from two core vertices is assigned arbitrarily to one of the two core vertices.

In one embodiment, the modification to the weighted Voronoi diagram $V(C_i)$ is accomplished by slightly modifying the original algorithm that constructs the weighted Voronoi diagram $V(C_i)$ (e.g., include more forty-five degree rays emanating from core points). In another embodiment, the modification to the weighted Voronoi diagram $V(C_i)$ is accomplished by constructing the original diagram and then drawing additional forty-five degree rays from the core points of $C_i$. A new Voronoi vertex is then inserted for every intersection of the new rays with existing Voronoi edges in linear time. Intersections among the new rays are resolved arbitrarily (e.g., giving priority to the ray inserted first).

The Voronoi region of a core point may now consist of several subregions delimited by the forty-five degree rays; the union of these subregions forms the Voronoi region of the core point. The properties and the asymptotic combinatorial complexity of the Voronoi diagram remain the same, thus the same notation, $V(C_i)$, may be used to imply the modified Voronoi diagram. In one embodiment, all new regions assigned to articulation points are emphasized in the Voronoi diagram. Thus, the modification of the Voronoi diagram, $V(C_i)$, essentially breaks ties between core points and core segments in favor of core points. Areas equidistant from multiple core vertices may still exist.

A defect, D, is classified as order k, $k \geq 1$, if the defect, D, overlaps k wire segments as induced by k distinct core elements of core(N, A). In the case of core elements that are equidistant (in a weighted sense) from the center of the defect, D, a $k^{th}$ order defect is allowed to overlap more than k wire segments. A defect, D, induced by exactly k distinct core elements is referred to as pure $k^{th}$ order. Note that a core segment, s, in core(N, A) consists of three distinct core elements: two endpoints and an open line segment.

If a defect, D, is a second order strictly minimal open breaking the net, N, then the defect, D, must be generated by a point along a non-emphasized, non-standard forty-five degree Voronoi edge or a non-emphasized Voronoi vertex of the Voronoi diagram $V(C_i)$. Thus, the set of all potential second order generators for strictly minimal opens is the set of closed-line segments corresponding to non-emphasized, non-standard forty-five degree Voronoi edges of the Voronoi diagram, $V(C_i)$, and any points corresponding to isolated Voronoi vertices incident to only standard forty-five degree Voronoi edges. In the example of FIG. 7, the potential second order generators are illustrated as $\{g_1, g_2, g_3\}$. Any Voronoi edge, g, of the Voronoi diagram, $V(C_i)$, is induced by a pair of elements in core($C_i$) (say $c_i, c_j$), such that the edge, g, is a portion of the bisector $b(c_i, c_j)$. Any Voronoi vertex incident to a forty-five degree ray from a core point, $c_k$, is attributed to the core point, $c_k$, with no need to distinguish between the relevant quadrant. Under this convention, Voronoi vertices may be induced by only two or more core elements of $C_i$.

To determine if a Voronoi edge or Voronoi vertex, g, is indeed a generator for opens, core(g) is designated as the set of core elements inducing the Voronoi edge or Voronoi vertex, g. For a Voronoi edge, core(g) is always a pair; for a Voronoi vertex, core(g) may contain more than two elements equidistant from g. There are three possible outcomes with respect to the connectivity of the biconnected component, $C_i$, after the removal of the elements of core(g) in the weighted Voronoi diagram, $V(C_i)$: (1) Removing core(g) does not disconnect the biconnected component, $C_i$ (thus, label as "no disconnect"); (2) Removing core(g) disconnects the biconnected component, $C_i$, but does not break it (thus, label as "trivial disconnect"); or (3) Removing core(g) breaks the biconnected component, $C_i$ (thus, label as "break").

If a potential generator, g, is labeled "break", then the potential generator, g, must be a second order generator for opens. Otherwise, the potential generator, g, cannot be a pure second order generator (however, portions of the potential generator, g, might still be k>2 order generators.

The set of second order generators determined from the Voronoi diagram, $V(C_i)$ that are labeled as "break" may be denoted as $\text{Gen}_2(C_i)$. Because there may be regions equidistant from multiple core elements assigned arbitrarily to a single core element in $L_\infty$, portions of a potential generator, g, might generate opens even in "no disconnect" and "trivial disconnect" cases described above. Those opens, however, can be regarded as of order k>2, and will be discovered in subsequent steps. In FIG. 7, $\text{Gen}_2(C_i) = \{g_1, g_2\}$. Elements of $\text{Gen}_2(C_i)$ are shaded.

To determine (k>2) order generators (if any), one can simply repeat the above process until all regions of the Voronoi diagram are emphasized. In practice, most biconnected components are sparse graphs, in their majority just simple cycles, and thus k will remain small in most situations. For this reason, it is in some cases acceptable from a practical standpoint to determine only first and second order generators. However, a method for iterating this process to determine all higher order generators for the biconnected component $C_i$ is discussed below.

Assume that $V^k(C_i)$ denotes the $k^{th}$-order Voronoi diagram of the biconnected component, $C_i$, where $k \geq 2$ (slightly modified to fit the problem). Thus, for k=1, one has $V(C_i)$. $V^k(C_i)$ is obtained from $V^{k-1}(C_i)$ with an iterative process. Emphasized regions of $V^{k-1}(C_i)$ remain emphasized in $V^k(C_i)$, and no further k-order subdivision is performed within.

For every non-emphasized region of $V^{k-1}(C_i)$, the k-order Voronoi diagram within is computed. In one embodiment, this is done by first designating $H^{k-1}$ as the set of core elements owning a region of $V^{k-1}(C_i)$. $N(H^{k-1})$ denotes the set of core elements owning all regions neighboring $\text{reg}(H^{k-1})$. When determining the neighbors of $\text{reg}(H^{k-1})$, all subregions induced by forty-five degree rays emanating from core points in $H^{k-1}$ are assumed to be part of $\text{reg}(H^{k-1})$. The open portion of a core segment and its endpoints are treated as distinct core elements.

The weighted $L_\infty$ Voronoi diagram of $N(H^{k-1})$, denoted as $V(N(H^{k-1}))$, is then computed and truncated within the interior of $\text{reg}(H^{k-1})$ to give the $k^{th}$ order subdivision within $\text{reg}(H^{k-1})$. Once the $k^{th}$ order subdivision is performed within two neighboring regions of $V^{k-1}(C_i)$, or within a region neighboring an emphasized region, removal of the Voronoi edge h of $V^{k-1}(C_i)$, which bounds the two regions, is considered.

The core elements inducing the Voronoi edge, h, are denoted as $c_i, c_j$. If both $c_i, c_j$ are owners of both new $k^{th}$ order regions neighboring the Voronoi edge, h, then the Voronoi edge, h, is removed, and the two neighboring regions are merged into a single region. Otherwise, the Voronoi edge, h, is not removed and remains part of $V^k(C_i)$. If the Voronoi edge, h, had been emphasized and is removed, the resulting merged k h order region is emphasized. The result of this process is $V^k(C_i)$. Any region of $V(C_i)$ owned by a tuple that induced a k order generator is also emphasized.

In one embodiment, the iteration process can be accelerated by the following observation: If $H^{k-1}$ contains a core point, p, and $N(H^{k-1})$ contains an open core segment, s(p), incident to the core point, p, then no additional information with respect to generators for opens can be obtained by considering the open core segment, s(p), in the $k^{th}$ order subdivision within $\text{reg}(H^{k-1})$. Note that a defect breaking a vertex of the biconnected component, $C_i$, has the effect of breaking all incident edges, but not vice versa. In other words, a $k^{th}$ order open, D, that overlaps the wire segment, R(p), induced by the core point, p, is also a $(k+d)^{th}$ order open, where d is the degree of the core point, p.

In one embodiment, unnecessary iterations that add no new information with respect to the problem are be reduced by adopting the following convention: Let $s(H^{k-1})$ denote the set of core segments that are incident to core points in $H^{k-1}$. Further, let $N(s(H^{k-1}))$ denote the union of core elements owning Voronoi regions incident to regions of core segments in $s(H^{k-1})$. Also let $N'(H^{k-1})=N(H^{k-1})-s(H^{k-1})\cup N(s(H^{k-1}))-H^{k-1}$. Instead of considering $V(N(H^{k-1}))$ to obtain the $k^{th}$ order subdivision with reg($H^{k-1}$), one can consider $V(N'(H^{k-1}))$. Everything else remains the same. Under this convention, the iteration process obtains a modified $k^{th}$ order Voronoi diagram denoted as $V'^k(C_i)$. Under this convention, emphasized regions of the Voronoi diagram will expand at a faster rate.

Given $V^k(C_i)$ (or $V'^k(C_i)$), $k \geq 1$, the set $Gen_{k+1}(C_i)$ of (k+1) order generators for opens can be derived using a direct generalization of the process for k=1. Thus, the set of all potential k+1 order generators for strictly minimal opens must be the set of non-emphasized, non-standard forty-five degree Voronoi edges of $V^k(C_i)$ or Voronoi vertices incident to only standard forty-five degree Voronoi edges.

Let h be such a Voronoi edge of the Voronoi diagram, $V^k(C_i)$, and let H be the associated tuple of core elements. That is, the tuple, H, is the union of the k-tuples that own the Voronoi regions bordering the Voronoi edge, h. Assuming no degeneracies (areas equidistant from multiple core elements), the tuple H should be a (k+1) tuple (i.e., the neighboring regions differ at exactly one pair of elements which actually induces the Voronoi edge, h). However, due to degeneracies, the cardinality of the tuple, H, may be larger than (k+1).

Any additional core elements in this case must be equidistant from the Voronoi edge, h, making no combinatorial difference as to which core element is assumed to own the Voronoi edge, h. A defect generated by the Voronoi edge, h, is still regarded as order (k+1), as any additional core elements overlapped by the Voronoi edge, h, are simply equidistant from the Voronoi edge, h. To determine if the Voronoi edge is, indeed, a generator for opens, the connectivity of the biconnected component, $C_i$, is checked after removing the tuple, H. As in the case of k=1, there are three possible outcomes to characterize the Voronoi edge, h: no disconnect, trivial disconnect and break, depending on whether the removal of the tuple, H, does not disconnect, disconnects but does not break, or breaks the biconnected component $C_i$. If the Voronoi edge, h, is characterized as "break", the Voronoi edge, h, is included in the set $Gen_{k+1}(C_i)$ and is emphasized in the Voronoi diagram. It becomes clear that the set $\cup Gen_k(C_i)$ must include all strictly minimal generators for opens involving elements of the biconnected component, $C_i$.

Labeling of $V^k(C_i)$, $k \geq 1$ includes, for every non-emphasized Voronoi region reg(H) where H is the tuple of core elements owning the region, deleting all elements of the tuple, H, from the biconnected component, $C_i$, and determining new biconnected components, net or trivial bridges and net or trivial articulation points. For every potential generator, g, bounding the region, reg(H), let $c_j$ denote the core element $c_j \notin H$ inducing g (i.e., $g \in b(c_j, h_i)$ for some $h_i \in H$). Potential generator, g, is labeled "no disconnect" if and only if the core element, $c_j$, is part of a new biconnected component of $C_i-H$; potential generator, g, is labeled "disconnect no break" if and only if the core element, $c_j$, is a trivial bridge or a trivial articulation point in $C_i-H$; and potential generator, g, is labeled "break" if and only if the core element, $c_j$, is a new net bridge or net articulation point in $C_i-H$.

Note that in the presence of degeneracies (i.e., areas equidistant from multiple core elements), there may be multiple equidistant core elements that define the potential generator, g (i.e., more than one $c_j$). In the case of an open core segment and its endpoint, the core segment can be ignored—removing the endpoint from the biconnected component, $C_i$, effectively removes all incident edges. In the case of multiple equidistant vertices, more than one core element may need to be considered. If, for any of these core elements, the potential generator, g, is labeled "break", then the potential generator g, must be an actual generator.

The size of the Voronoi diagram, $V^k(C_i)$, is $O(k|C_i|)$, and the time to compute the DFS tree of $C_i-H$ is $O(C_i)$. Thus, one gets the $O(kn^2)$ term in the asymptotic total time complexity. In the case of second-order generators (i.e., k=2), faster algorithms can be derived using more advanced algorithmic techniques; however, for simplicity of presentation, only the simple derivation is described herein. In the case where the biconnected component, $C_i$, is a simple cycle (as is often the case in practice), the removal of any pair of edges from the biconnected component, $C_i$, disconnects the biconnected component, $C_i$. Thus, in this case, one only need determine the pairs whose removal breaks the biconnected component, $C_i$. This can be accomplished easily in a single pass of the biconnected component, $C_i$. First, each articulation point or terminal point along the biconnected component, $C_i$, is identified and uniquely distinguished (e.g., by marking each articulation point or terminal point in a different color). Under the assumption that the root of the DFS tree, $G_\pi(N, A)$, is a terminal point, it follows that the root of $G_\pi(C_i)$ must be an articulation point or a terminal point. All edges of $G_\pi(C_i)$ are then distinguished in accordance with the articulation points or terminal points that precede them (e.g., by marking the edges in the corresponding colors). It is then easy to see that the removal of a pair of edges breaks the biconnected component, $C_i$, if the pair of edges are distinguished differently (e.g., have different colors).

Once the generators for opens have been identified, the method 300 proceeds to step 312 and computes the Voronoi diagram of the identified generators for opens. It will be noted that, in practice, one may want to speed up computation and compute only first and second order generators before proceeding to step 312. Assume that V(G) is the weighted $L_\infty$ Voronoi diagram of the set, G, of all generators for opens on the layer, A of the net, N. The critical radius for opens for any point, t, on the layer, A, is $r_c(t)=d_w(t, s)$, where $t \in reg(s)$ in the weighted $L_\infty$ Voronoi diagram, V(G).

In $L_\infty$, the weighted $L_\infty$ Voronoi diagram, V(G), is equivalent to the weighted Voronoi diagram of additively weighted segments, where the weight function along any segment, s, corresponds to an $L_\infty$ distance from a line. For a Manhattan layout, generators are axis-parallel segments or points, and the weights are all constant. Such a Voronoi diagram may have disconnected regions. Any portions of the set, G, of generators that correspond to generator points that are not strictly minimal will not be part of the final Voronoi diagram, V(G). The portion(s) of a generator, s, entirely enclosed within a region, reg(s) $\in$ V(G), is herein referred to as "active". Any remaining portions are herein referred to as "inactive".

For example, for a Manhattan layout in which all polygons on a layer, A, are assumed to be axis-parallel, assume that $s \in G$ is a generator of any order and $e_i$, $e_j$ is a pair of polygonal elements inducing the generator, s. That is, the generator, s, is a portion of the bisector $b(e_i, e_j)$. In the rectilinear case, the weight of the generator, s, is a constant $w(s)=d(s, e_i)$; accordingly, R(s) denotes the rectangle generated by the generator, s (i.e., the rectangle of size $2w(s) \times (|s|+2w(s))$ obtained by unioning all defects (squares) generated by points on s). More generally, R(s) denotes the wedge obtained by unioning all defects generated by the generator, s. For any point, p, along the generator, s, square(p) denotes the square generated by the point, p.

A generator, $s_i$, is said to be interacting with a generator, $s_j$, if $w(s_i)$, $(s_j)$ and $R(s_i)$ intersects $R(s_j)$ in a non-trivial way. That is, $R(s_i) \cup R(s_j)$ is an area that at least encloses square(p) for some point, p∈$s_i$. Accordingly, the set, G, of generators has the following properties: (1) a generator, s, is strictly minimal if and only if there is no other generator interacting with s; (2) the Voronoi region of a strictly minimal generator, s, in the Voronoi diagram V(G), is connected, and the generator, s, is entirely contained in the region, reg(s) (i.e., the generator, s, is entirely active); (3) all first-order generators are strictly minimal; and (4) no two generators associated with the same biconnected component of a net, N, (first-order or higher) interact with each other.

If K denotes the number of interacting pairs of generators, then an upper bound for K is $O(n^2)$. In practice, the number of interacting higher-order generators must be small, and thus K must also be small. A natural upper bound on the size of the Voronoi diagram, V(G), is O(n+K), where n is the complexity of the layer, A. In the case of simple breaks, all generators are first-order, and thus Voronoi regions are connected, and the size of the Voronoi diagram, V(G), is O(n). Higher-order generators may have disconnected Voronoi regions similar to the Voronoi diagram of additively weighed segments. In other words, higher-order generators may have multiple active portions, and, thus, appropriate active events need to be generated to capture the beginning of any such active sub-segment in the construction of the Voronoi diagram.

In one embodiment, the Voronoi diagram, V(G), is computed in O((n+K)log n) time by plane sweep, for example by generalizing the plane sweep algorithm described by E. Papadopoulou et al. in "Critical Area Computation For Missing Material Defects In VLSI Circuits", IEEE Transactions on Computer-Aided Design, vol. 20, no. 5, pp. 583-597, 2001, which is herein incorporated by reference in its entirety.

First, a sweepline, L, is imagined that sweeps the set, G, of generators from left to right. Two major components are associated with plane sweep algorithms: (1) a sweep line status, T, which maintains the status of the sweeping process; and (2) an event list, Q, that contains the events at which the sweep line status changes. The event list, Q, is ordered in increasing priority value, and throughout the sweeping process, a partial Voronoi diagram of all generators to the left of the sweepline (including the sweepline) is maintained. The wavefront is the collection of Voronoi edges (portions of bisectors) bounding the Voronoi cell of the sweepline. The bisectors and generators incident to the wavefront are referred to as "spike bisectors" and "spike generators", respectively. As the sweepline moves to the right, the wavefront and the endpoints of spike bisectors also move to the right. The sweepline status, T, maintains the combinatorial structure of the wavefront, and the status, T, is implemented as a height-balanced tree.

The event list, Q, is implemented as a priority queue. There are three types of events that may occur in the event list, Q: site events, spike events and active events. Site events are caused by the endpoints of generators and correspond to potential new waves entering the wavefront. Spike events correspond to potential Voronoi vertices and are determined by the intersection of two neighboring spike bisectors or a spike bisector and a neighboring spike generator. At a spike event, a wave is deleted from the wavefront. Active events delimit the potential beginning of an active portion of a generator along a higher-order generator segment. Active events may cause new waves to enter the wavefront in a manner similar to site events. In the absence of higher-order generators or of interacting higher-order generators, no active events are generated.

Each type of event has a priority value that determines the order in which associated events are processed. The priority of any event, q, is priority(q)=q.x+w(q), where .x denotes an x coordinate and w(q) denotes the weight of the event, q. For a spike event, w(q) $d_w$(g, q), where g is one of the generators that induces the spike event, q. For a site event or an active event, q, along a generator segment, w(q) is the ordinary weight of the generator point. In other words, the time at which any event, q, is processed is the time at which the sweepline reaches the right side of the square generated by the event, q (i.e., the square centered at the event, q, and having a radius of w(q)).

If $g=\overline{g_1g_2}$ is a generator segment such that priority($g_1$)< priority($g_2$), and p is a point along the generator, g, then the point, p, is active in the Voronoi diagram V(G) if and only if square(p) contains no generator interacting with the point, p. Recall that a generator, h, interacts with a point, p, if there is a point q∈h such that square (q) is entirely enclosed in square (p). If the point, p, is an inactive point along the generator, g, and h is a generator interacting with square(p), then the first possible active point along the generator, $\overline{pg_2}$, is the point, q, that is equidistant from the generators h and g in a weighted sense, if such a point exists (i.e., 2w(q)=$d_w$(q, h) and priority (q)>priority(p); q is the intersection of the generator, $\overline{pg_2}$, and the bisector b(g, h)). The point, q, exists if 2w($p_2$)<$d_w$($p_2$, h) and the segment $\overline{pq}$ is inactive. Otherwise (i.e., if 2w($p_2$)≥$d_w$ ($p_2$, h), the entire generator, $\overline{pg_2}$, must be inactive.

At time t=priority(p), generator point, p, is inactive if and only if the point, p, lies behind the wavefront. This condition is easily detected by extending a horizontal ray, r, from the sweepline toward the wavefront and passing through the point, p. The event induced by the point, p, is a site event if p=$p_1$, $p_2$ and is an active event in all other cases. If w is the wave intersected by the ray, r; h is the generator owning the wave, w (i.e., r∩w∈reg(h)inV(G)); and the point, p, is assumed to be inactive, then an active event may be generated that represents the point along the generator, $\overline{pg_2}$, that is equidistant, in the weighted sense, from generators h and g. As described above, such a point exists if and only if 2w($p_2$)< $d_w$($p_2$, h), and the point is easy to compute given the generator, h. Otherwise, no active event is generated and the entire generator, $\overline{pg_2}$, can be ignored as inactive.

The handling of spike events differs from ordinary Voronoi diagram construction in a minor sense. Every time a new spike bisector or generator is inserted in the wavefront, the intersections of the spike bisector or generator with its upper and lower neighbors are determined to result in one or more new spike events. Here, intersections (spike events) are not only determined from neighboring spike bisectors, but also from neighboring higher-order generators. The intersection of a new spike bisector with its neighboring higher-order generator delimits a potential ending of the active portion of the generator. To distinguish from ordinary spike events, the event of such an intersection is referred to as an "active spike event". The handling of the two types of spike events is similar (e.g., deleting a wave and finalizing the incident portion of the wavefront). In the rectilinear case, there are no spike events between spike generators and spike bisectors.

Another point of difference is the generation of potential active elements every time a portion of the wavefront is finalized. If a finalized portion of the wavefront is incident to a spike higher-order generator, g, then the ending of an active portion of the generator, g, is found. In this case, a new active event on the generator, g, may need to be generated to predict a potential new active portion of the generator of higher-order priority, if the conditions apply. The active event is generated in the manner described above.

Although the L∞ metric corresponding to square defects is described herein, the same approach discussed above would be valid if applied to other types of defects, including regular polygons and circles. For example, the approach described above can be implemented for an octagonal defect (or more generally to a k-sided defect) as presented, for example, by Chen et al. in "Robustness of k-gon Voronoi Diagram Construction", Information Processing Letters, 97, (2006), pp. 138-145, which is herein incorporated by reference in its entirety. Thus, the concepts described herein are not limited in application to the geometries and distances metrics discussed for illustrative purposes herein.

Referring back to FIG. 3, once the opens Voronoi diagram is constructed, the method 300 proceeds to step 314 and computes the entire critical area integral in accordance with the Voronoi diagram. In one embodiment, the critical area integral is computed in accordance with the methods described by E. Papadopoulou et al., supra. In particular, the critical area integral is discretized as a summation of simple terms derived from Voronoi edges. The method 300 then terminates in step 316.

For defect distributions other than $1/x^3$, critical area can still be computed as the summation of critical areas in each Voronoi region. Within one Voronoi region, even if the analytic formula derived for the case $1/x^3$ is not applicable, one can still apply the algorithm given by Papadopoulou et al. in "Critical Area Computation Via Voronoi Diagrams", IEEE Transactions of Computer-Aided Design, 1999, which is herein incorporated by reference in its entirety. In this case, a Voronoi region is subdivided into appropriate smaller sub-regions, where the critical radius is readily available for every point (and, therefore, critical area can be computed analytically within each sub-region). Once analytic formulas are derived for the given defect distribution, $D(r)$, of any form, critical area can be computed by summing the formulas in each Voronoi region.

To compute the critical area for all missing material defects on the layer, A, the generators for opens on the layer, A, are combined with the generators for via-blocks. Generators for via blocks are axis-parallel weighted segments (core segments) that correspond to portions of the farthest point Voronoi diagram of via clusters. In one embodiment, generators for via blocks are produced as described by E. Papadopoulou, supra. Combining open generators and via-block generators changes nothing in the construction of the weighted Voronoi diagram of core segments as described above. Thus, the Voronoi subdivision for opens on the layer, A, can easily be extended to a Voronoi subdivision for general missing material defects.

Figure 8:
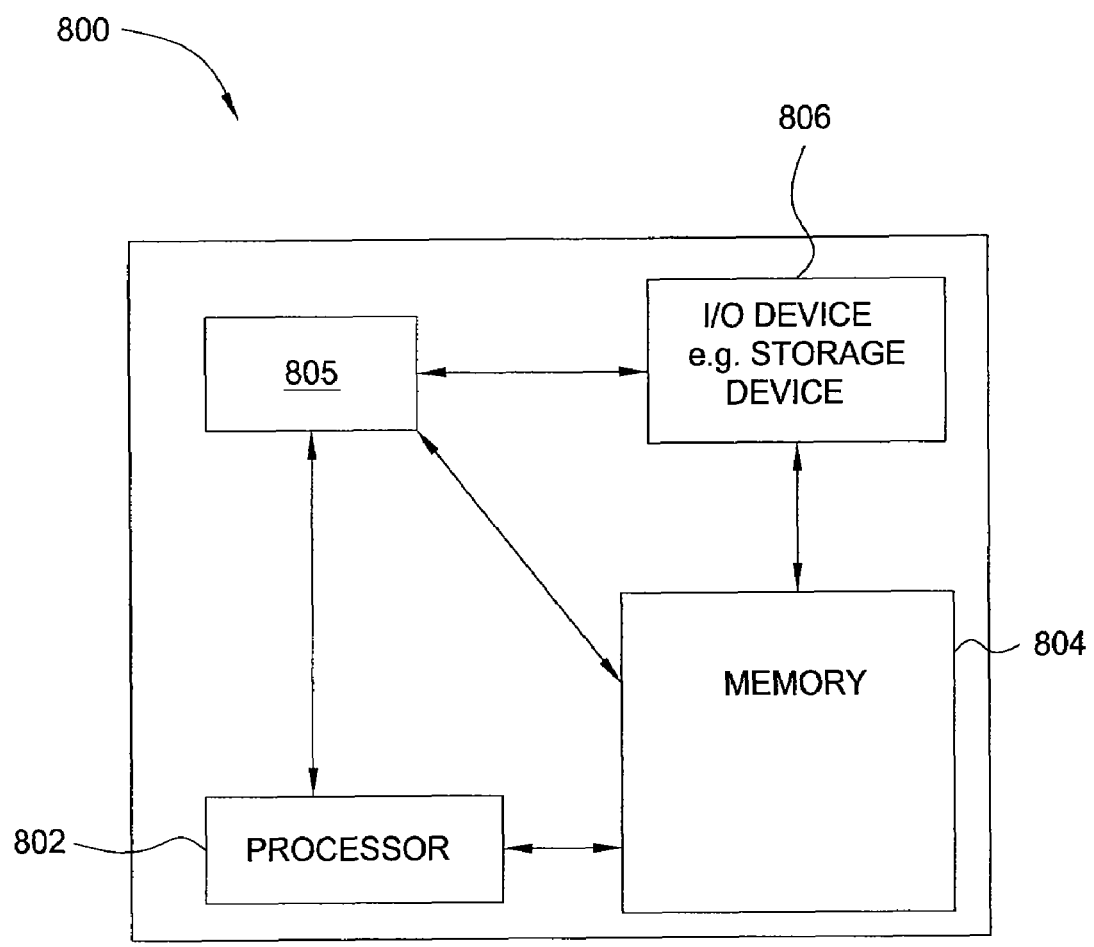
FIG. 8 is a high level block diagram of the present critical area computation method that is implemented using a general purpose computing device.

FIG. 8 is a high level block diagram of the present critical area computation method that is implemented using a general purpose computing device 800. In one embodiment, a general purpose computing device 800 comprises a processor 802, a memory 804, a critical area computation module 805 and various input/output (I/O) devices 806 such as a display, a keyboard, a mouse, a modem, and the like. In one embodiment, at least one I/O device is a storage device (e.g., a disk drive, an optical disk drive, a floppy disk drive). It should be understood that the critical area computation module 805 can be implemented as a physical device or subsystem that is coupled to a processor through a communication channel.

Alternatively, the critical area computation module 805 can be represented by one or more software applications (or even a combination of software and hardware, e.g., using Application Specific Integrated Circuits (ASIC)), where the software is loaded from a storage medium (e.g., I/O devices 506) and operated by the processor 802 in the memory 804 of the general purpose computing device 800. Thus, in one embodiment, the critical area computation module 805 for computing the critical area of VLSI chips described herein with reference to the preceding Figures can be stored on a computer readable medium or carrier (e.g., RAM, magnetic or optical drive or diskette, and the like).

Thus, the present invention represents a significant advancement in the field of VLSI devices. A method and apparatus are provided that enable a net-aware means of accurately computing critical area for opens, even in the presence of loops, ultimately enabling more efficient design of IC chips.

While foregoing is directed to the preferred embodiment of the present invention, other and further embodiments of the invention may be devised without departing from the basic scope thereof, and the scope thereof is determined by the claims that follow.

The invention claimed is:

1. A method for determining a critical area of an integrated circuit, the method comprising:
    modeling a net corresponding to the integrated circuit as a graph, the net comprising a plurality of interconnected shapes spanning one or more layers of the integrated circuit;
    identifying at least a subset of generators for opens in the net, wherein the identifying comprises:
        classifying at least two of the plurality of interconnected shapes as terminal shapes, where said terminal shapes are shapes that are to remain connected by the net;
        finding any defect in the net that breaks all paths between two or more of the terminal shapes; and
        finding any defect in the net that breaks one or more of the terminal shapes; and
    computing, using a processor, the critical area in accordance with a Voronoi diagram of the at least a subset of generators.

2. The method of claim 1, wherein the modeling comprises:
    representing each polygon that occurs on a conducting layer of the net as a graph node; and
    defining an edge between any two graph nodes if a contact or via connects polygons represented by the two graph nodes.

3. The method of claim 2, wherein the identifying comprises:
    defining, for a layer of the net on which the critical area is to be computed, an extended graph of the net on the layer, where each node on the layer is expanded by a graph corresponding to a medial axis of a polygon represented by the node; and
    detecting one or more loops in the extended graph, where a loop represents a redundant interconnect in the integrated circuit.

4. The method of claim 3, wherein the detecting comprises:
    partitioning the extended graph into one or more biconnected components, one or more bridges and one or more articulation points.

5. The method of claim 4, wherein the partitioning is performed in accordance with depth-first searching.

6. The method of claim 4, wherein the one or more loops are revealed by one or more of the one or more biconnected components.

7. The method of claim 1, wherein the generators for opens comprise:
    centers of found defects; and
    segments formed as unions of the centers.

8. The method of claim 7, wherein defects are found by:
    determining a core of an extended version of the graph; and
    detecting one or more first-order generators in accordance with the core, the first-order generators being generators that create opens by breaking a single interconnect between two or more terminal shapes.

9. The method of claim 8, further comprising:
determining one or more potential higher-order generators in accordance with the Voronoi diagram, the higher-order generators being generators that create opens by breaking more than one interconnect between two or more terminal shapes; and
designating as a higher-order generator any of the one or more potential higher-order generators corresponding to elements of a layout that would, if graph representations corresponding to the elements were removed from the extended version of the graph, break a biconnected component.

10. The method of claim 1, wherein the computing comprises:
combining generators for opens on a given layer of the net with generators for via-blocks on the layer to produce a critical area for missing material defects in the integrated circuit.

11. A computer readable storage medium containing an executable program for determining a critical area of an integrated circuit, where the program performs the steps of:
modeling a net corresponding to the integrated circuit as a graph, the net comprising a plurality of interconnected shapes spanning one or more layers of the integrated circuit;
identifying at least a subset of generators for opens in the net, wherein the identifying comprises:
classifying at least two of the plurality of interconnected shapes as terminal shapes, where said terminal shapes are shapes that are to remain connected by the net;
finding any defect in the net that breaks all paths between two or more of the terminal shapes; and
finding any defect in the net that breaks one or more of the terminal shapes; and
computing the critical area in accordance with a Voronoi diagram of the at least a subset of generators.

12. The computer readable storage medium of claim 11, wherein the modeling comprises:
representing each polygon that occurs on a conducting layer of the net as a graph node; and
defining an edge between any two graph nodes if a contact or via connects polygons represented by the two graph nodes.

13. The computer readable storage medium of claim 12, wherein the identifying comprises:
defining, for a layer of the net on which the critical area is to be computed, an extended graph of the net on the layer, where each node on the layer is expanded by a graph corresponding to a medial axis of a polygon represented by the node; and
detecting one or more loops in the extended graph, where a loop represents a redundant interconnect in the integrated circuit.

14. The computer readable storage medium of claim 13, wherein the detecting comprises:
partitioning the extended graph into one or more biconnected components, one or more bridges and one or more articulation points.

15. The computer readable storage medium of claim 14, wherein the partitioning is performed in accordance with depth-first searching.

16. The computer readable storage medium of claim 14, wherein the one or more loops are revealed by one or more of the one or more biconnected components.

17. The computer readable storage medium of claim 11, wherein the generators for opens comprise:
centers of found defects; and
segments formed as unions of the centers.

18. The computer readable storage medium of claim 17, wherein defects are found by:
determining a core of an extended version of the graph; and
detecting one or more first-order generators in accordance with the core, the first-order generators being generators that create opens by breaking a single interconnect between two or more terminal shapes.

19. The computer readable storage medium of claim 18, further comprising:
determining one or more potential higher-order generators in accordance with the Voronoi diagram, the higher-order generators being generators that create opens by breaking more than one interconnect between two or more terminal shapes; and
designating as a higher-order generator any of the one or more potential higher-order generators corresponding to elements of a layout that would, if graph representations corresponding to the elements were removed from the extended version of the graph, break a biconnected component.

20. The computer readable storage medium of claim 11, wherein the computing comprises:
combining generators for opens on a given layer of the net with generators for via-blocks on the layer to produce a critical area for missing material defects in the integrated circuit.

21. Apparatus for determining a critical area of an integrated circuit, the apparatus comprising:
means for modeling a net corresponding to the integrated circuit as a graph, the net comprising a plurality of interconnected shapes spanning one or more layers of the integrated circuit;
means for identifying at least a subset of generators for opens in the net, wherein the means for identifying comprises:
means for classifying at least two of the plurality of interconnected shapes as terminal shapes, where said terminal shapes are shapes that are to remain connected by the net;
means for finding any defect in the net that breaks all paths between two or more of the terminal shapes; and
means for finding any defect in the net that breaks one or more of the terminal shapes; and
means for computing the critical area in accordance with a Voronoi diagram of the at least a subset of generators.

22. The apparatus of claim 21, wherein the means for modeling comprises:
means for representing each polygon that occurs on a conducting layer of the net as a graph node; and
means for defining an edge between any two graph nodes if a contact or via connects polygons represented by the two graph nodes.

23. The apparatus of claim 22, wherein the means for identifying comprises:
means for defining, for a layer of the net on which the critical area is to be computed, an extended graph of the net on the layer, where each node on the layer is expanded by a graph corresponding to a medial axis of a polygon represented by the node; and
means for detecting one or more loops in the extended graph, where a loop represents a redundant interconnect in the integrated circuit.

24. The apparatus of claim 23, wherein the means for detecting comprises:

means for partitioning the extended graph into one or more biconnected components, one or more bridges and one or more articulation points.

25. The apparatus of claim 24, wherein the partitioning is performed in accordance with depth-first searching.

26. The apparatus of claim 24, wherein the one or more loops are revealed by one or more of the one or more biconnected components.

27. The apparatus of claim 21, wherein the generators for opens comprise:

centers of found defects; and segments formed as unions of the centers.

28. The apparatus of claim 27, wherein defects are found by:

determining a core of an extended version of the graph; and detecting one or more first-order generators in accordance with the core, the first-order generators being generators that create opens by breaking a single interconnect between two or more terminal shapes.

29. The apparatus of claim 28, further comprising:

means for determining one or more potential higher-order generators in accordance with the Voronoi diagram, the higher-order generators being generators that create opens by breaking more than one interconnect between two or more terminal shapes; and means for designating as a higher-order generator any of the one or more potential higher-order generators corresponding to elements of a layout that would, if graph representations corresponding to the elements were removed from the extended version of the graph, break a biconnected component.

30. The apparatus of claim 21, wherein the means for computing comprises:

means for combining generators for opens on a given layer of the net with generators for via-blocks on the layer to produce a critical area for missing material defects in the integrated circuit.

* * * * *